US010037862B2

(12) United States Patent
Sijbrandij et al.

(10) Patent No.: US 10,037,862 B2
(45) Date of Patent: Jul. 31, 2018

(54) CHARGED PARTICLE DETECTING DEVICE AND CHARGED PARTICLE BEAM SYSTEM WITH SAME

(71) Applicant: Carl Zeiss Microscopy, LLC, Thornwood, NY (US)

(72) Inventors: Sybren J. Sijbrandij, Wakefield, MA (US); John A. Notte, IV, Gloucester, MA (US); Raymond Hill, Rowley, MA (US)

(73) Assignee: Carl Zeiss Microscopy, LLC, Thornwood, NY (US)

( * ) Notice: Subject to any disclaimer, the term of this patent is extended or adjusted under 35 U.S.C. 154(b) by 73 days.

(21) Appl. No.: 15/163,401

(22) Filed: May 24, 2016

(65) Prior Publication Data

US 2017/0032925 A1    Feb. 2, 2017

Related U.S. Application Data

(60) Provisional application No. 62/199,715, filed on Jul. 31, 2015.

(51) Int. Cl.
*H01J 37/05* (2006.01)
*H01J 37/244* (2006.01)

(52) U.S. Cl.
CPC ............ *H01J 37/05* (2013.01); *H01J 37/244* (2013.01); *H01J 2237/2443* (2013.01); *H01J 2237/2445* (2013.01); *H01J 2237/2448* (2013.01); *H01J 2237/24435* (2013.01); *H01J 2237/24495* (2013.01); *H01J 2237/24564* (2013.01)

(58) Field of Classification Search
CPC ............... H01J 37/05; H01J 2237/2443; H01J 2237/24564
See application file for complete search history.

(56) References Cited

U.S. PATENT DOCUMENTS

| 2005/0035291 A1* | 2/2005 | Hill ...................... H01J 37/026 250/309 |
| 2007/0018099 A1* | 1/2007 | Chitturi .................. G01B 15/08 250/310 |
| 2015/0008332 A1 | 1/2015 | Notte, IV et al. |

FOREIGN PATENT DOCUMENTS

| EP | 1365260 A1 | 11/2003 |
| EP | 1636819 A2 | 3/2006 |
| EP | 2297763 A2 | 3/2011 |
| WO | WO 2005/004186 | 1/2005 |
| WO | WO 2009/144727 | 12/2009 |

* cited by examiner

*Primary Examiner* — David Porta
*Assistant Examiner* — Mindy Vu
(74) *Attorney, Agent, or Firm* — Fish & Richardson P.C.

(57) ABSTRACT

A charged particle detecting device includes: a holding structure; a first charged particle detector at the terminal portion of the holding structure; a second charged particle detector at the terminal portion of the holding structure; a detector head at the terminal portion of the holding structure; and a first electrode which is transmissive for the first and second species of charged particles covering an entrance opening of the detector head.

20 Claims, 3 Drawing Sheets

CHARGED PARTICLE DETECTING DEVICE AND CHARGED PARTICLE BEAM SYSTEM WITH SAME

CROSS-REFERENCE TO RELATED APPLICATIONS

This application also claims benefit under 35 U.S.C. § 119(e) to U.S. Application No. 62/199,715, filed Jul. 31, 2015. The contents of this applications is hereby incorporated by reference in its entirety.

FIELD

The present disclosure relates to charged particle detecting devices and charged particle beam systems including charged particle detecting devices. More particularly, the present disclosure relates to charged particle detection devices being capable to detect different kinds of charged particles such as ions and electrons.

BACKGROUND

Charged particle detectors are employed in charged particle beam system to generate an electrical output signal based on charged particles leaving a sample surface due to impinging primary charged particles. By scanning the primary charged particle beam across a sample surface and recording a signal based on charged particles leaving the sample surface in dependence on the position of the impinging primary charged particle beam an image of the sample surface can be generated. If such images are recorded based on different species of charged particles leaving the sample surface, such as for example secondary electrons and secondary ions, images with different contrast characteristics can be formed.

Charged particle detecting devices being capable to detect electrons as well as ions are for example disclosed in EP 1636819 A2, EP 1365260 A2 or EP 2297763 A2. The disclosed charged particle detecting devices include an ion-to-electron converter as well as a detector which generates an electrical output signal if electrons impinge on an electron-sensitive surface of the detector. If electrons are to be detected a control electrode is biased with a voltage that the electrons directly impinge on the electron-sensitive surface of the detector. If ions are to be detected, the control electrode is biased with a voltage so that ions impinge onto the ion-to-electron converter; the electrons emitted by the ion-to-electron converter are thereafter detected by the detector.

SUMMARY

The disclosure seeks to provide a charged particle detecting device with an improved detection efficiency for different species of charged particles to be detected as well as a compact design. The disclosure also seeks to provide a charged particle beam system with a charged particle detection device with an improved detection efficiency for different species of charged particles to be detected and a resulting capability to generate images of a sample surface with improved brightness and contrast.

An embodiment includes a charged particle detecting device having a holding structure having a terminal portion, a first charged particle detector arranged at the terminal portion of the holding structure, the first charged particle detector being configured to generate a first electrical signal when a first species of charged particles impinges on the first charged particle detector. The charged particle detecting device further includes a detector head arranged at the terminal portion of the holding structure, the detector head defining a hollow volume within which a particle entrance surface of the first charged particle detector is arrange. A second charged particle detector is arranged at the detector head with a particle entrance surface of the second detector arranged within the hollow volume of the detector head. The second charged particle detector is configured to generate a second electrical signal when a second species of charged particles impinges on the second charged particle detector. A first electrode transmissive for the first and second species of charged particles is provided and covers an entrance opening of the detector head.

The first species of charged particles can be electrons and the second species of charged particles can be positively charged ions.

The charged particle detecting device further includes a voltage supply unit configured to supply alternatively a positive or a negative first voltage to the first electrode.

The voltage supply unit can be further configured to apply a positive second voltage to a second electrode of the first charged particle detector.

The voltage supply unit can be further configured to apply a negative third voltage to a third electrode of the second charged particle detector.

The voltage supply unit can be configured to concurrently apply a positive voltage to the second electrode and a negative voltage to the third electrode.

The first charged particle detector can be a scintillation detector including a scintillator and a photo-multiplier tube.

The second charged particle detector can include at least one of a continuous dynode electron multiplier, for example a channel electron multiplier or a micro-channel plate, and a discrete dynode electron multiplier.

With the disclosed charged particle detecting device it is possible to produce images with relatively high signal to noise ratio for a given dosage of the primary charged particle beam onto the sample.

With the disclosed charged particle detecting device it is also it is also possible to produce images based on detected secondary ions, in situations when the secondary electrons are not useful for generating images, for example while simultaneously operating a flood gun or because an image based on detected secondary ions does not provide sufficient contrast or does not show the details in which the user of the system is interested in.

With the disclosed charged particle detecting device it is further possible to distinguish between two materials of the sample based upon their differing rate at which they produce secondary electrons or secondary ions. Thereby the detection device can serve as a process monitor such as an endpoint indicator providing a signal used as an indicator to stop a processing of the sample. Such endpoint detection is especially useful for applications such as ion beam milling in which the primary ion beam—or a second ion beam generated by a second ion beam column is used for processing a sample.

A further embodiment features a charged particle beam system including a charged particle source, a charged particle optical system forming a charged particle beam from charged particles emitted by the charged particle source, and a charged particle detecting device having a holding structure having a terminal portion, a first charged particle detector arranged at the terminal portion of the holding structure, the first charged particle detector being configured to generate a first electrical signal when a first species of charged particles impinges on the first charged particle detector. The charged particle detecting device of the charged particle beam system further includes a detector head arranged at the terminal portion of the holding structure, the detector head defining a hollow volume within which a particle entrance surface of the first charged particle detector is arrange. A second charged particle detector is arranged at the detector head with a particle entrance surface of the second detector arranged within the hollow volume of the detector head. The second charged particle detector is configured to generate a second electrical signal when a second species of charged particles impinges on the second charged particle detector. A first electrode transmissive for the first and second species of charged particles is provided and covers an entrance opening of the detector head.

An electrode transmissive to charged particles herein is understood as an electrode through which charged particles such as electrons or ions having an energy of several hundred eV up to 15 keV can pass without a considerable amount of absorption. Example can be a grid-like electrode or a mesh-like electrode or some other kind of electrode providing a considerable number of openings.

Further embodiments are described by the claims.

BRIEF DESCRIPTION OF THE DRAWINGS

In the following an embodiment of the disclosure will be described in more detail with reference to the accompanying drawings, in which.

DETAILED DESCRIPTION

Figure 1:
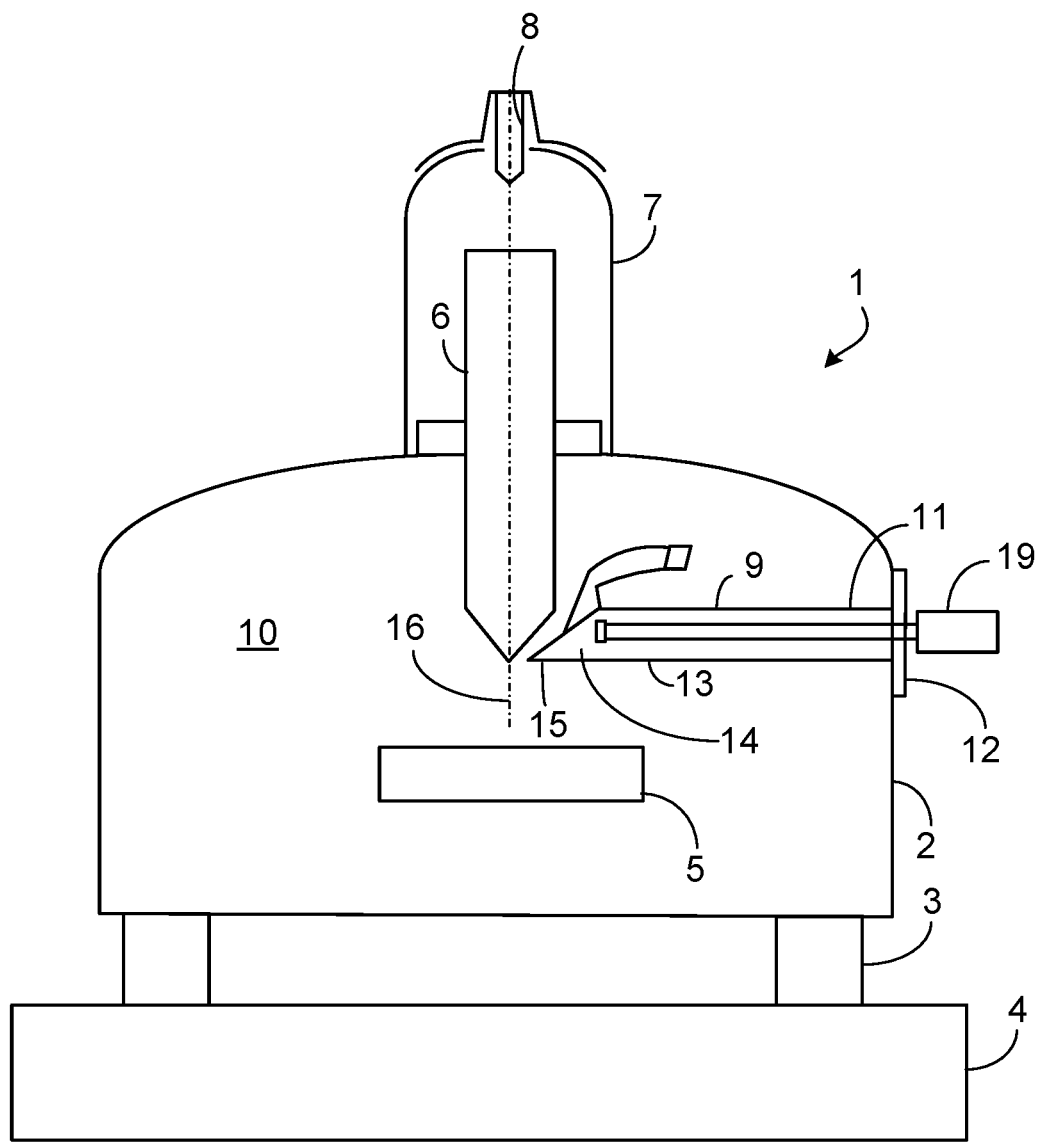
FIG. 1 shows a schematic of a sectional view of a charged particle beam system.

The charged particle beam system 1 in FIG. 1 includes a sample chamber 10 which is positioned and mounted on a heavy and massive table 4. The table 4 can be a granite plate or a plate made of concrete.

The sample chamber 10 rests on the table 4 via a number of legs 3. The design of the sample chamber 10 resting vial legs 3 on a massive table 4 serves for vibration isolation and damping, as for example is described in more detail in US 20150008332 A1 which is herein fully incorporated by reference.

The sample chamber 10 has a vacuum tight housing 2. A tubular extension 7 is firmly and non-detachable mounted to the housing 2 of the sample chamber 10. The tubular extension 7 can be formed by a metal tube welded to the remaining portions of the housing 2 surrounding the sample chamber 10. Alternatively, the tubular extension can be an integral part of the chamber housing itself.

Within the tubular extension 7 a charged particle column 6 is mounted. The charged particle column 6 thereby includes lenses, especially a final objective lens, diaphragms and beam scanning systems not shown in FIG. 1.

On the tubular extension 7 of the housing 2 of the sample chamber a module including a charged particle source 8 is attached.

Within the sample chamber 10 a stage 5 for receiving a sample to be investigated or processed is provided. In addition, within the sample chamber 10 a charged particle detecting device 9 is provided. The charged particle detecting device 9 is attached by a holding structure 11 to a flange 12 in the housing 2 of the sample chamber. Opposing to the end at which the holding structure 11 is mounted to the housing 2 of the sample chamber the holding structure includes a termination portion 13 carrying a detector head 14. The detector head 14 includes a metal housing. A grid electrode 15 covers an opening in the metal housing of the detector head 14. The opening, when the detecting device is installed in the sample chamber 10, is oriented into the direction of the sample surface. The charged particle detecting device 9 will be described below in more detail.

When operating the charged particle beam system 1 charged particles, for example ions such helium or neon ions or gallium ions, are generated by the charged particle source 8 and a primary charged particle beam, such as an ion beam, is formed by the charged particle optical column 6 and focused by an objective lens of the charged particle column 6 onto a sample positioned on sample stage 5. Due to the impinging charged particles secondary particles, such as positively charged ions and negatively charged electrons are caused to leave the sample. At least a portion of either the secondary ions or secondary electrons leaving the sample due to the impinging primary charged particle beam are detected by the charged particle detecting device 9 and converted to an electrical signal.

Which species of the charged particles is detected depends on a first voltage applied to the grid electrode 15. If the voltage of the grid electrode 15 is positive, i.e. the electrical potential of the grid electrode 15 is positive compared to the electrical potential of the sample stage 5, electrons emitted by a sample positioned on sample stage 5 are attracted by the grid electrode and enter into the detector head 14 from below. If the voltage of the grid electrode 15 is negative, i.e. the electrical potential of the grid electrode 15 is negative compared to the electrical potential of the sample stage 5, positively charged ions emitted by a sample positioned on sample stage 5 are attracted by the grid electrode and enter into the detector head 14 from below.

The electrical signal generated by the charged particle detecting device, if required after further electronic amplification, is used as imaging signal. By scanning the sample surface by deflecting the primary charged particle beam perpendicularly to the optical axis 16 of the charged particle beam column 6 and allocating the electrical signal generated by the charged particle detecting device 9 to the respective location at which the primary charged particle beam impinges onto the sample surface an image of the sample surface can be generated, stored and displayed on a display.

Figure 2:
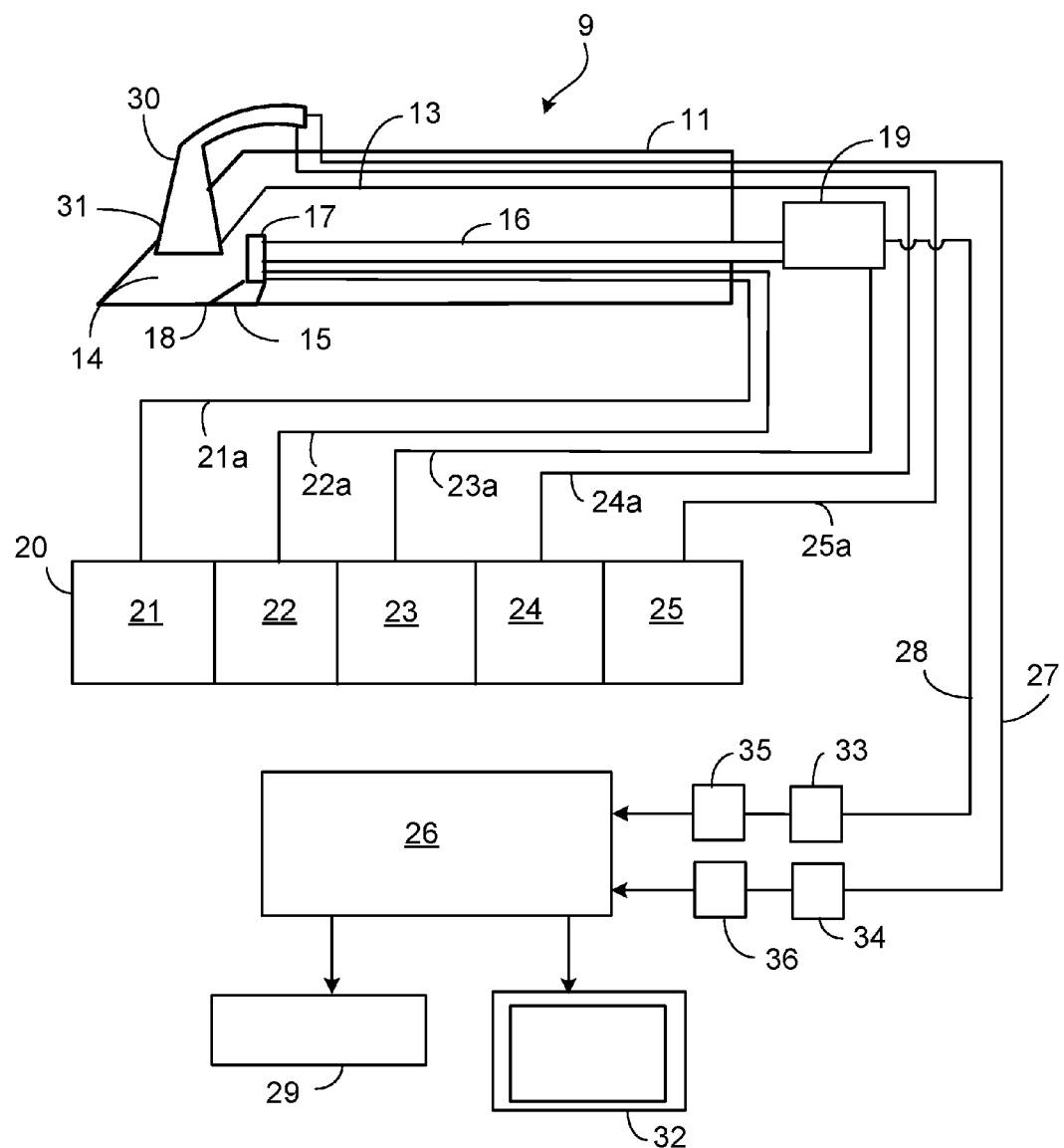
FIG. 2 shows a schematic of a sectional view of an embodiment of a charged particle detecting device.

FIG. 2 is a more detailed sectional view of the charged particle detecting device 9. The charged particle detecting device 9 includes a holding structure 11 having a termination portion 13. When the charged particle detecting device is installed within the sample chamber 10 of the charged particle beam system, the termination portion 13 of holding structure 11 is close to the lower end of the charged particle beam column 6. At the termination portion 13 a detector head 14 is provided at the holding structure 11.

The holding structure 11 includes within a hollow tube a light guide 16 extending in a longitudinal direction of the holding structure 11. The light guide 16 at the side of the detector head 14 terminates with a plane surface. A scintillator plate 17 is arranged in front of the terminating plane surface of the light guide 16. Alternatively the front surface of the light guide can be covered by a scintillator layer. A second electrode 18 in the form of a ring electrode surrounding the scintillator is provided. At the other end a photomultiplier 19 is attached to the light guide 16. Photomultiplier 19, light guide 16, scintillator 17 and second electrode 18 form the first charged particle detector. This first charged particle detector is especially configured to generate electrical signals based on electrons impinging on scintillator 18. It should be noted that the photomultiplier 19 can be arranged outside the inner volume of vacuum chamber 10.

Partially within the detector head 14 in addition a second charged particle detector is arranged. This second charged particle detector includes a funnel-shaped electron multiplier 30. The electron multiplier 30 serves as an ion-to electron converter as well as for amplifying electrons. The electron multiplier includes a metallic coating surrounding the larger opening of the funnel, which forms a third electrode 31. The larger opening of the funnel forms the entrance surface of the electron multiplier. In some embodiments a metal grid or mesh (not shown) can be provided in front of the entrance surface of the electron multiplier. In operation, ions attracted by the electrical potential applied to the grid electrode 15 and third electrode 31 pass the entrance surface of the electron multiplier and impinge on the metal coating of the electron multiplier. Due to their energy they generate tertiary electrons with a rate of more than one tertiary electron per impinging ion. The tertiary electrons are accelerated further and generate additional electrons each time an electron collides with the metal coating of the electron multiplier. In this manner an burst of tertiary electrons are generated by each impinging ion.

The grid electrode 15 forms a part of the outer wall of the detector head 14 and forms a particle entrance opening of the detector head.

The entrance opening of the electron multiplier 30 is arranged in a plane which is almost parallel to the plane in which the grid electrode 15 is arranged. The scintillator 17 forms a particle entrance surface of the first detector.

The charged particle detecting device further includes a voltage supply 20 which can consist of five voltage supply units 21-25 the output voltages of which can be independently adjusted. Alternatively the voltage supply 20 can be a single voltage supply unit capable of providing five output voltages which are independently adjustable.

A first voltage supply unit 21 serves to supply either a positive or a negative voltage to the grid electrode 15. The output voltage of this first voltage supply unit 21 can at least be adjusted between −500 Volts and +500 Volts, more preferably between −1000 Volts and +1000 Volts relative to the electrical potential of the sample stage. Accordingly, the first voltage supply unit 21 is electrically connected to the grid electrode 15 via a first cable 21a.

A second voltage supply unit 22 serves to supply a second voltage to the second electrode 18 of the first charged particle detector. This second voltage always is positive relative to the potential of the sample stage. This second voltage can be adjusted between 500 Volts and at least 10 kV. Accordingly, the second voltage supply unit 22 is electrically connected to the second electrode 18 via a second cable 22a.

A third voltage supply unit 23 provides the operating voltage of the photomultiplier 19. Accordingly the third voltage supply unit 23 is electrically connected to the photomultiplier 19 via a third cable 23a.

A fourth voltage supply unit 24 serves to supply a third voltage to the third electrode 31 of the second charged particle detector. This third voltage always is negative relative to the potential of the sample stage. This third voltage can be adjusted between 0 Volts and at least −10 kV. Accordingly, the fourth voltage supply unit 24 is electrically connected to the third electrode 31 via a second cable 24a.

A fifth voltage supply 25 provides the operating voltage of the electron multiplier 30 of the second charged particle detector. Accordingly, the fifth voltage supply unit 25 is electrically connected to the electron multiplier 30 via a fifth cable 25a.

Two further lines 27, 28 connect the output of each of the photomultiplier 19 of the first charged particle detector and the electron multiplier 30 of the second charged particle detector to a computer 26. These further lines 27, 28 serve to transmit the electrical output signals generated by the first and the second charged particle detectors via electronic amplifiers 33, 34 and analog-to-digital converters 35, 36 to the computer 26. Computer 26 also controls the scanning of the primary charged particle beam across the sample via a scan control 29 and forms images of the sample based on the position at which the primary charged particle beam impinges onto the sample and the associated electrical output signal provided by the first and/or second charged particle detector on a display 32. In this embodiment individual electronic amplifiers are provided for amplifying the output signal of the first charged particle detector and the second charged particle detector, respectively, so that each output signal is amplified to the desired signal level.

It should be noted that the grid electrode 15 is desirably transmissive for electrons and ions. Instead of a grid electrode also a sufficient thin metal electrode can be employed if the thickness of the metal layer of such electrode is sufficiently thin so that a large amount of ions and electrons can transmit such layer.

In the above described embodiment the second electrode 18 and the third electrode 31 are realized as ring electrodes, either surrounding the scintillator 17 or the entrance surface of the electron multiplier 30. Alternatively the second electrode can be a grid electrode in front of or covering the scintillator 17. Similarly, the third electrode can be a grid electrode in front of or on the entrance surface of the electron multiplier 30.

The charged particle detecting device 9 can be operated in an electron detection mode and an ion detection mode.

In the electron detection mode a positive voltage of several hundred Volts relative to the sample stage, i.e. +200 to +1000V is applied to the grid electrode 15 and a voltage of several thousand volts, i.e. +2 to +10 kV is applied to the second electrode 18.

Concurrently the grid electrode 31 is at the electrical potential of the sample stage 5 or at a negative voltage relative to the sample stage of several 100 volts, i.e. 0 to −1000V. Electrons leaving the sample surface are attracted by the grid electrode, enter the detector head through the grid electrode 15 and are within the detector head 14 attracted by the strong positive potential of the second electrode. They impinge on the scintillator 17 and generate photons which are guided through the light guide 16 to the photomultiplier 19. In photomultiplier 19 an electrical signal is generated which is proportional to the number of detected photons and thereby proportional to the number of electrons impinging on scintillator 17. The negative voltage applied to the third electrode 31 serves to further increase the probability that an electron entering the detector head 14 through the grid electrode 15 also impinges on scintillator 17.

In the ion detection mode a negative voltage of several hundred Volts relative to the sample stage, i.e. −200 to −1000V is applied to the grid electrode 15 and a negative voltage of several thousand volts, i.e. −2 to −10 kV is applied to the third electrode 31.

Concurrently the second electrode 18 is at the electrical potential of the sample stage 5 or at a positive voltage relative to the sample stage of several kilovolts, i.e. 0 to +5 kV. Positively charged ions leaving the sample surface are attracted by the grid electrode, enter the detector head 14 through the grid electrode 15 and, within the detector head 14, are attracted by the strong negative potential of the third electrode. They impinge on the inner walls (i.e. inner surface of the metal coating) of electron multiplier 30 and generate tertiary electrons. The electrical signal generated at the output of electron multiplier 30 is proportional to the number of ions entering the entrance opening of the electron multiplier 30 through its entrance surface. The positive voltage applied to the second electrode 18 serves to further increase the probability that an ion entering the detector head 14 through the grid electrode 15 also passes the entrance opening of the electron multiplier.

Figure 3:
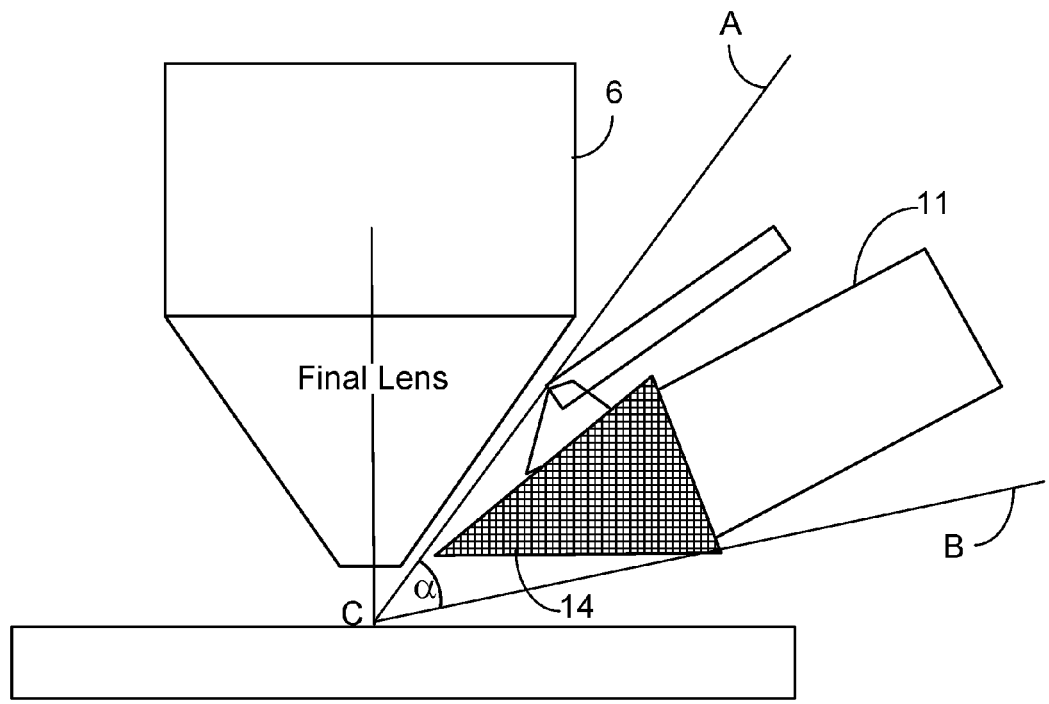
FIG. 3 shows another schematic of a sectional view of an embodiment of a charged particle detecting device in a plane including the optical axis of a charged particle beam system.

FIG. 3 shows a further schematic illustration of the charged particle detecting device when arranged in a charged particle beam system having a final lens with a conical shape. FIG. 3 is a sectional view in a plane containing the optical axis of the charged particle beam system. From the perspective of a point C on the optical axis of the primary charged particle beam in which the charged particle beam is focused or impinges on the sample surface of a sample the outer dimension of the complete charged particle detecting device are enveloped by axes A and B which include an angle α. This angle α defines the angular height of the charged particle detecting device which is less than 35°.

Figure 4:
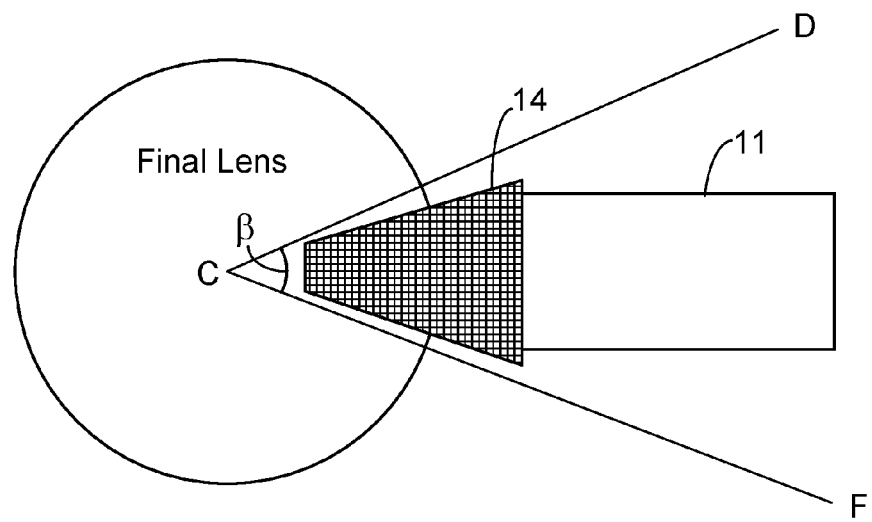
FIG. 4 shows a sectional view of the embodiment in FIG. 3 in a plane perpendicular to the optical axis.

FIG. 4 shows the charged particle detecting device of FIG. 3 in a sectional plane perpendicular to the optical axis of the charged particle beam system. In this sectional plane the detector head 14 has a trapezoidal form with the smaller edge directed to the charged particle beam axis. From perspective of a point C on the optical axis of the primary charged particle beam in which the charged particle beam is focused or impinges on the sample surface of a sample the outer dimension of the complete charged particle detecting device are enveloped by axes D and F which include an angle β. This angle β defines the angular widths of the charged particle detecting device which is less than 45°.

The angular width of the charged particle detecting device defines how many different components can be arranged within the same plane around the optical axis without interference between them. Because for a number of applications it is desirable to install a couple of different detectors or other accessories an angular width as small as possible is desirable. The angular height of the charged particle detecting device defines how close the charged particle detecting device can be arranged to the optical axis of the charged particle beam system which is important for a high detection efficiency.

The disclosed charged particle detecting device has a compact design with angular dimensions of less than 35 degrees in angular width and 45 degrees in angular height.

This allows the charged particle detecting system to be used in conjunction with other accessories without withdrawal, and staying within a distance of 6 mm or less from the optical axis of the primary charged particle beam.

The disclosed charged particle detecting device in addition can have a collection efficiency of 80% or more for secondary electrons and 60% or more for secondary ions if the voltages applied to the first, second and third electrode are adjusted in a proper manner. This means that with properly adjusted voltages 80% of all secondary electrons leaving the sample due to the impinging primary charged particle beam are detected by the charged particle detecting device in the electron detection mode and 60% of all secondary ions leaving the sample due to the impinging primary charged particle beam are detected by the charged particle detecting device in the ion detection mode.

What is claimed is:

1. A charged particle detecting device, comprising:
a holding structure having a terminal portion;
a first charged particle detector arranged at the terminal portion of the holding structure, the first charged particle detector configured to generate a first electrical signal when a first species of charged particles impinges on the first charged particle detector;
a second charged particle detector arranged at the terminal portion of the holding structure, the second charged particle detector configured to generate a second electrical signal when a second species of charged particles impinges on the second charged particle detector;
a detector head arranged at the terminal portion of the holding structure, the detector head defining a volume within which a particle entrance surface of the first charged particle detector and a particle entrance surface of the second charged particle detector are arranged; and
a first electrode transmissive for the first and second species of charges particles covering an entrance opening of the detector head.

2. The charged particle detecting device of claim 1, wherein the first species of charged particles comprise electrons, and the second species of charged particles comprise positively charged ions.

3. The charged particle detecting device of claim 2, further comprising a voltage supply configured to supply alternatively a positive voltage to the first electrode or a negative first voltage to the first electrode.

4. The charged particle detection device of claim 3, further comprising a second electrode, wherein the voltage supply is configured to apply a positive second voltage to the second electrode.

5. The charged particle detection device of claim 4, further comprising a third electrode, wherein the voltage supply is configured to apply a negative third voltage to the third electrode.

6. The charged particle detection system of claim 5, wherein the voltage supply is configured to concurrently apply a positive fourth voltage to the second electrode and a negative voltage to the third electrode.

7. The charged particle detecting system of claim 1, wherein the first charged particle detector is a scintillation detector comprising a scintillator and a photo-multiplier tube.

8. The charged particle detecting device of claim 1, wherein the second charged particle detector comprises at least one member selected from the group consisting of a discrete dynode electron multiplier and a continuous dynode electron multiplier.

9. The charged particle detecting device of claim 8, wherein second charged particle detector comprises a member selected from the group consisting of a channel electron multiplier and a micro-channel plate.

10. The charged particle detecting device of claim 1, wherein the charged particle detecting device has angular dimensions of less than 35° in angular width and 45° in angular height.

11. The charged particle detecting device of claim 1, wherein the charged particle detecting device has a collection efficiency of 80% or more for secondary electrons, and the charged particle device has a collection efficiency of 60% or more for secondary ions.

12. The charged particle detecting device of claim 1, further comprising a voltage supply configured to supply alternatively a positive voltage to the first electrode or a negative first voltage to the first electrode.

13. The charged particle detection device of claim 12, further comprising a second electrode, wherein the voltage supply is configured to apply a positive second voltage to the second electrode.

14. The charged particle detection device of claim 13, further comprising a third electrode, wherein the voltage supply is configured to apply a negative third voltage to the third electrode.

15. The charged particle detection system of claim 14, wherein the voltage supply is configured to concurrently apply a positive fourth voltage to the second electrode and a negative voltage to the third electrode.

16. A charged particle beam system, comprising:
a charged particle source;
a charged particle optical system forming a charged particle beam from charged particles emitted by the charged particle source; and
a charged particle detection device according to claim 1.

17. The charged particle system of claim 16, wherein the first species of charged particles comprise electrons, and the second species of charged particles comprise positively charged ions.

18. The charged particle system of claim 17, further comprising a voltage supply configured to supply alternatively a positive voltage to the first electrode or a negative first voltage to the first electrode.

19. The charged particle system of claim 16, further comprising a voltage supply configured to supply alternatively a positive voltage to the first electrode or a negative first voltage to the first electrode.

20. The charged particle system of claim 16, wherein the second charged particle detector comprises at least one member selected from the group consisting of a discrete dynode electron multiplier and a continuous dynode electron multiplier.

* * * * *